(12) United States Patent
Williams et al.

(10) Patent No.: US 10,727,643 B1
(45) Date of Patent: Jul. 28, 2020

(54) MASTER OSCILLATOR POWER AMPLIFIER

(71) Applicant: II-VI Delaware, Inc., Wilmington, DE (US)

(72) Inventors: Martin R. Williams, Big Flats, NY (US); Timothy K. Zahnley, Savona, NY (US); Thomas W. McNamara, Corning, NY (US); Aravanan Gurusami, Morgan Hill, CA (US); Scott Dahl, Lindley, NY (US); Siegfried Fleischer, Los Gatos, CA (US)

(73) Assignee: II-VI Delaware, Inc., Wilmington, DE (US)

(*) Notice: Subject to any disclaimer, the term of this patent is extended or adjusted under 35 U.S.C. 154(b) by 0 days.

(21) Appl. No.: 16/268,315

(22) Filed: Feb. 5, 2019

(51) Int. Cl.
- *H01S 3/23* (2006.01)
- *G01S 17/02* (2020.01)
- *H03K 7/08* (2006.01)
- *H01S 3/067* (2006.01)

(52) U.S. Cl.
CPC .......... *H01S 3/2308* (2013.01); *G01S 17/02* (2013.01); *H01S 3/06754* (2013.01); *H03K 7/08* (2013.01)

(58) Field of Classification Search
CPC .............. H01S 3/2308; H01S 3/06754; H01S 3/23016; H01S 3/2316; G01S 17/02; H03K 7/08
See application file for complete search history.

(56) References Cited

U.S. PATENT DOCUMENTS

| | | |
|---|---|---|
| 6,678,088 B1 | 1/2004 | Stummer et al. |
| 6,831,779 B2 | 12/2004 | Caplan |
| 7,110,167 B2 | 9/2006 | Gurusami et al. |
| 7,233,606 B2 | 6/2007 | Varshneya et al. |
| 7,405,870 B2 | 7/2008 | Qiao et al. |
| 7,961,380 B2 | 6/2011 | Shia et al. |
| 8,175,127 B2 | 5/2012 | Gurusami et al. |

(Continued)

FOREIGN PATENT DOCUMENTS

EP    1 734 622    12/2006

OTHER PUBLICATIONS

Mahdi, Mohd, Adzir, et al., "Simplified ASE Correction Algorithm for Variable Gain-Flattened Erbium-Doped Fiber Amplifier", Optics Express, Jun. 8, 2009/vol. 17, No. 12, pp. 10069-10075.

(Continued)

*Primary Examiner* — Armando Rodriguez
(74) *Attorney, Agent, or Firm* — Wendy W. Koba

(57) ABSTRACT

A fiber-based master optical power amplifier (MOPA) is configured to utilize a pump source that operates in pulse mode with the arrival time of the pump pulses coordinated with the arrival time of the input pulses. The width of the pump pulses is also controlled, thus providing a mechanism for controlling both the amount of pump energy injected into the fiber amplifier, as well as the overlap in time between the pump pulse and the seed pulse. As the pulse repetition interval (PRI) of the input seed pulse changes, the timing of the pump pulses and their width are also changed so that a "constant gain" environment is created within the amplifying medium, providing an essentially constant energy output pulse, regardless of differences in ASE generated during different PRIs.

13 Claims, 6 Drawing Sheets

(56) References Cited

U.S. PATENT DOCUMENTS

| | | |
|---|---|---|
| 8,848,751 B2 | 9/2014 | Spiekermann |
| 8,908,264 B2 | 12/2014 | Lange |
| 9,007,682 B2 | 4/2015 | Shia et al. |
| 9,857,468 B1 | 1/2018 | Eichenholz et al. |
| 9,923,329 B2 | 3/2018 | Savage-Leuchs et al. |
| 2019/0221988 A1* | 7/2019 | Villeneuve ............ G01S 7/4804 |

OTHER PUBLICATIONS

Yu, Anthony W., et al., "Laser Amplifier Development for IPDA Lidar Measurements of CO2 from Space", Proc. of SPIE, vol. 9342, pp. 93420M-1 to 93420M-10, 2015.

* cited by examiner

MASTER OSCILLATOR POWER AMPLIFIER

TECHNICAL FIELD

The present invention relates to a master oscillator power amplifier (MOPA) and, more particularly, to a fiber-based MOPA configured to provide output pulses of constant energy regardless of changes in the input signal pulse repetition rate.

BACKGROUND

A MOPA is known in the art as a specific type of optical amplifier that comprises at least two separate elements, a laser source (the "master oscillator") and an optical amplifier. At times, the laser source is referred to as the "seed laser". As this name implies, the laser source is used to "seed" an optical amplifier with an input trigger signal that then generates a high power output signal pulse. By virtue of using a separate power amplification component, the various performance aspects of the laser source itself are decoupled from the requirements of the power generator. Indeed, the MOPA technology provides an efficient power scaling architecture for pulsed laser applications such as "light detection and ranging" (LIDAR). LIDAR is a technology that can be used to measure distances to remote targets, with a laser source used to generate optical pulses that are amplified and directed toward a target which then scatters the light. The separate power amplifier within the MOPA can thus be independently controlled to provide the desired amount of signal gain for a given LIDAR application. Some of the scattered light is received at a detector co-located with the laser source and the distance to the target is then determined based on one or more characteristics of the returned light.

In many LIDAR applications, a relatively high power (e.g., on the order of hundreds of watts) optical pulse is required so that the scattered, returned light has enough power to yield accurate distance calculations. For some applications (such as, for example, on-board automotive LIDAR systems), the MOPA is configured to generate extremely narrow output pulses and thus requires the use of nsec-scale seed laser pulses. The amplifier portion typically comprises a fiber-based (rare-earth) amplifier (such as an erbium-doped fiber amplifier, EDFA) that utilizes pump light at an appropriate wavelength (e.g., 980 nm) to excite the rare-earth ions in the fiber and thereby amplify the seed laser input signal pulses to a power level sufficient for the required "high power" output pulses. The seed laser is controlled to exhibit a predetermined pulse repetition rate. Instead of defining the input signal pulse train in terms of repetition rate, it is also common to define the pulse train by its "pulse repetition interval" (PRI), which defines the time interval between adjacent pulses (typically measured from the rising edge of a first pulse to the rising edge of a second pulse).

For applications such as LIDAR, there is a need to vary the PRI over an extended period of time to account for constant changes in the surrounding area being surveyed. Changing the PRI has been found to create a transient change in output energy, which is attributed to changes in the amount of amplified spontaneous emission (ASE), radiative noise, produced as the PRI is changed. Previously, this problem has been addressed by controlling the drive current applied to the pump source so as to modify the amount of pump energy available as a function of changes in PRI. This not considered as a satisfactory solution in many applications, such as MOPAs utilizing multiple PRIs that change rapidly as a function of time, since the gain response of the amplifier may not be managed as quickly as the change in PRI.

SUMMARY OF THE INVENTION

The needs remaining in the prior art are addressed by the present invention, which relates to a master oscillator power amplifier (MOPA) and, more particularly, to a fiber-based MOPA configured to provide high power output pulses of constant energy regardless of changes in the input signal pulse repetition rate (PRI).

In accordance with the principles of the present invention, a fiber-based MOPA is configured to utilize a pump source that operates in pulse mode (rather than CW, as in the prior art), with the arrival time of the pump pulses coordinated with the arrival time of the input seed pulses. The use of a pulsed pump is described in detail in U.S. Pat. No. 7,100,167, entitled "System and Method for Dynamic Range Extension and Stable Low Power Operation of Optical Amplifiers Using Pump Laser Pulse Modulation", issued on Sep. 19, 2006 to A. Gurusami et al. and herein incorporated by reference. In addition to the utilization of a pulsed pump as taught by Gurusami et al., the fiber-based MOPA of the present invention also controls the width of the pump pulses (as well as their arrival time), thus providing a mechanism for controlling both the amount of pump energy injected into the amplifier, as well as the overlap in time between the pump pulse and the input pulse. As the PRI of the input signal pulse changes, the timing of the pump pulses and their width are also changed so that a "constant gain" environment is created within the amplifying medium, providing an essentially constant energy output pulse, regulating the amount of ASE generated during different PRIs.

One embodiment of the present invention takes the form of a MOPA including a section of doped optical fiber for providing signal gain to input light in the presence of a pump light beam operating at a defined wavelength, an input pulse source for generating seed pulses applied as a first input to the section of doped optical fiber, the input pulse source designed to adjust a pulse repetition interval (PRI) between adjacent pulses in response to a "PRI change" control signal, an a pump source for generating pump pulses applied as a second input to the section of doped optical fiber. The presence of the seed and pump pulses within the section of doped optical fiber amplifies the power of the seed pulses and generates high-power optical output pulses. The pump pulse source itself is designed to control pump pulse parameters (including repetition rate and pulse width) to maintain an essentially constant energy in the high-power optical output pulses regardless of the seed pulse PRI.

Other and further aspects and principles of the present invention will become apparent during the course of the following discussion and by reference to the accompanying drawings.

BRIEF DESCRIPTION OF THE DRAWINGS

Referring now to the drawings.

DETAILED DESCRIPTION

Figure 1:
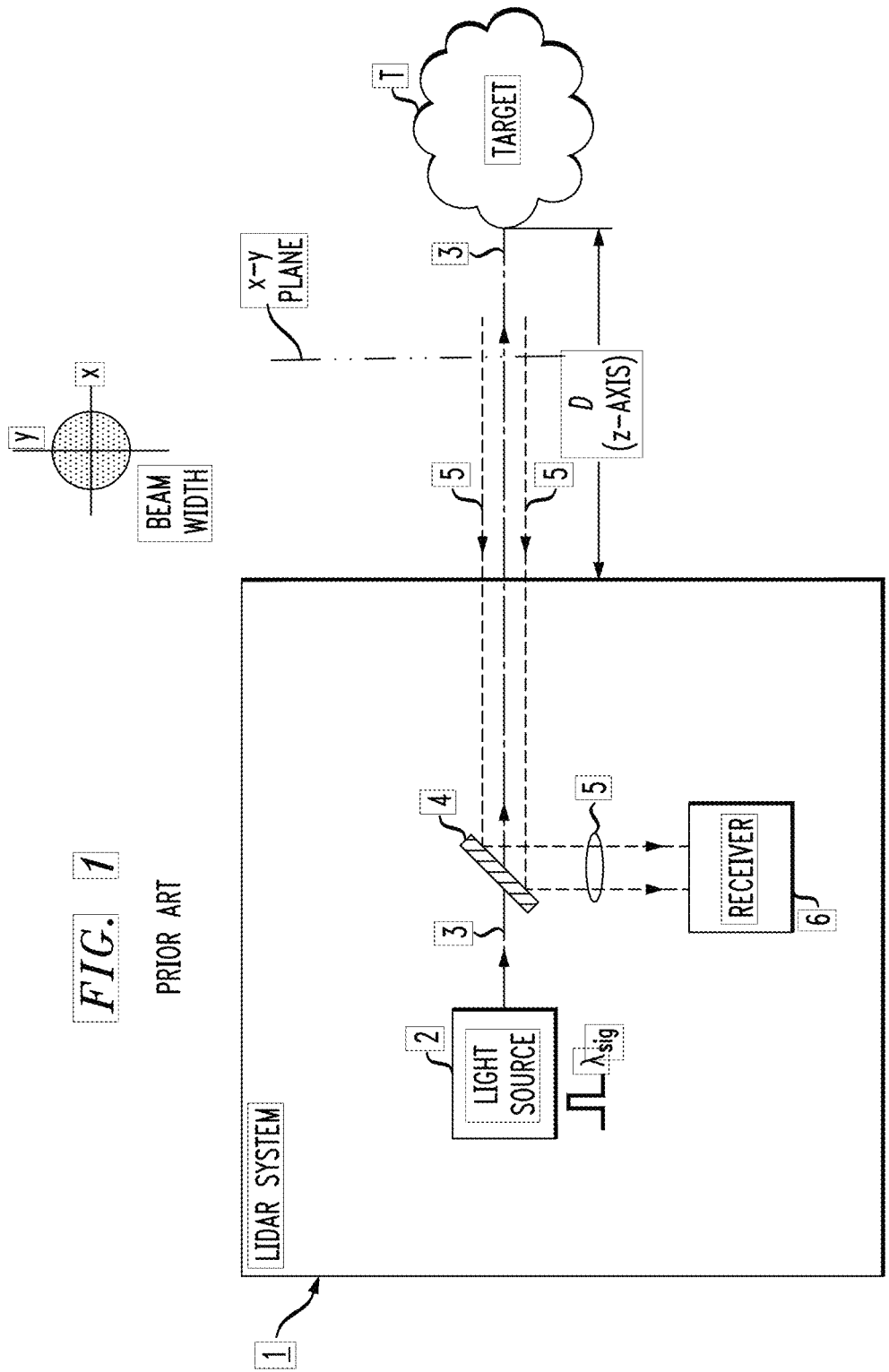
FIG. 1 is a simplified diagram of a prior art LIDAR system, useful for understanding an exemplary implementation of the constant pulse energy MOPA of the present invention.

Prior to describing the details of a MOPA formed in accordance with the principles of the present invention, a typical utilization of a MOPA as a component in a LIDAR system will be reviewed, providing a context for understanding the details of the principles of the present invention. FIG. 1 illustrates an exemplary LIDAR system 1 used to measure the distance D between system 1 and a target TAR. In the particular example of a vehicle-based LIDAR system, the target may be a second vehicle traveling down a road in front of the vehicle equipped with LIDAR system 1. System 1 includes a light source 2 that generates high-power light signal pulses 3, pulses 3 being of a predetermined wavelength $\lambda_{sig}$ and separated in time by a predetermined "pulse repetition interval", or simply PRI. Pulses 3 pass through a beam splitter 4 and exit system 1. As pulses 3 reach target TAR, some of the reflected/scattered light is directed back toward LIDAR system 1 as returned pulses 5. Returned pulses 5 are thereafter re-directed by beam splitter 4 into a receiver 6 that is configured to perform a programmed analysis of the pulses to determine, for example, the distance D between LIDAR system 1 and target TAR.

In many applications, there is a need to vary the PRI of pulses 3 exiting source 1. For example, a "long" PRI (i.e., a relatively long time between adjacent pulses) allows for long-range sensing. In LIDAR applications, a long PRI allows the system to "see" vehicles far ahead or behind and make appropriate decisions in a timely fashion (particularly required in dynamic situations where movement of targets occurs). The advantages of using a long PRI come at the cost of reduced spatial resolution in the x-y plane of the pulse (see FIG. 1). On the other hand, a "short" PRI (i.e., a relatively short time interval between adjacent input pulses) provides a higher degree of spatial resolution. The improved resolution comes at the cost of a shorter range (z-direction) over which a sufficient pulse power is maintained. A short PRI is useful, for example, in LIDAR applications where two target vehicles on adjacent lanes are relatively close to each other, but need to be identified as two separate vehicles. If the spatial resolution was too low in this case, the vehicles may appear to be a single large object. It is clear that for a vehicle-based LIDAR system to perform effectively, it needs to be able to adjust the PRI from time to time as traffic conditions change.

Figure 2:
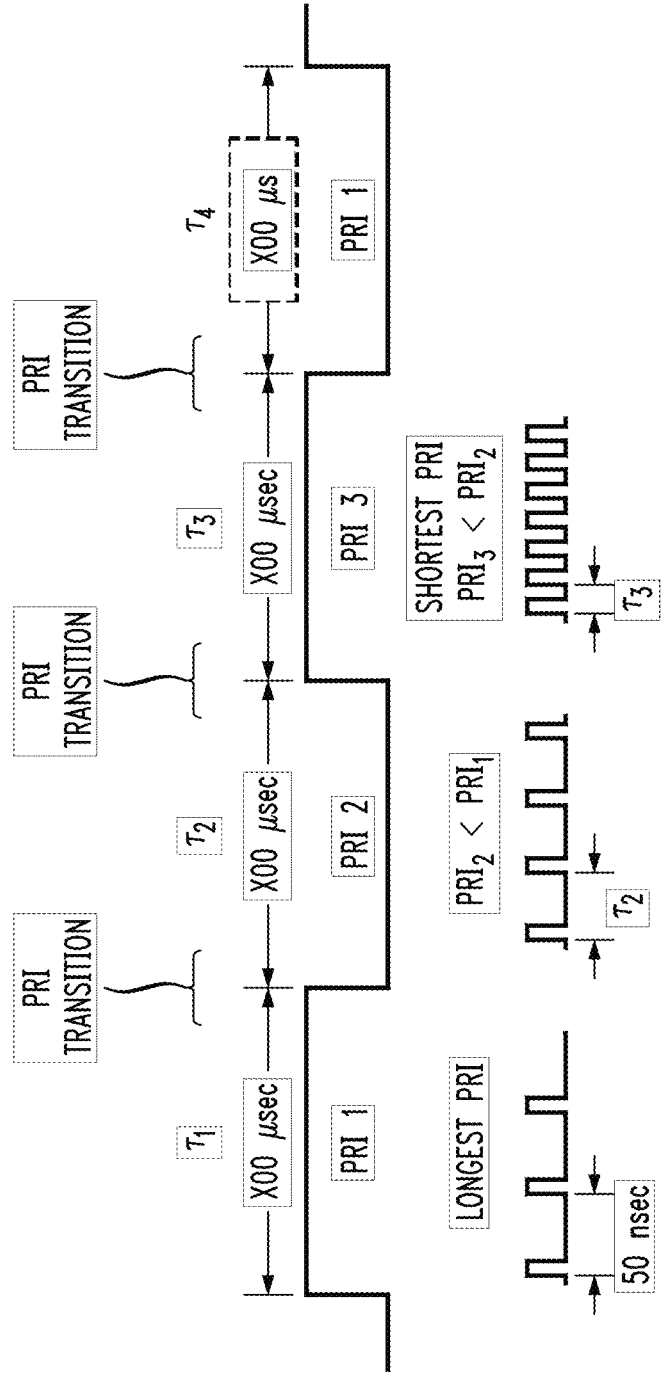
FIG. 2 is a diagram illustrating a sequence of four different PRIs, utilized in sequence to control a pulsed laser in an exemplary MOPA.

FIG. 2 is a timeline showing an exemplary implementation of varying the PRI of a seed pulse applied to a fiber-based optical amplifier. In this particular case, each PRI is sequentially utilized over fixed periods of time τ (shown as τ=X00 μsec in FIG. 2). It is to be noted that the periods of time τ need not necessarily be fixed; the drawing of FIG. 2 showing equal time periods is for the purposes of illustration only. Each time interval represents a different seed pulse PRI, that is, the PRI of the input pulses applied to the EDFA portion of an optical amplifier. In the timeline of FIG. 2, the process begins with input (seed) pulses defined to exhibit a first PRI, shown as $PRI_1$ in FIG. 2, where for the purposes of discussion it is presumed that $PRI_1$ is a relatively long time interval (e.g., an interval of 50 nsec) between seed pulses. This PRI is maintained for the duration of a first period of time $\tau_1$. Subsequently, the PRI is shortened in following time period $\tau_2$, depicted in FIG. 2 as $PRI_2 < PRI_1$. Shortening the PRI means that the time interval between adjacent seed pulses is reduced. The following third time period $\tau_3$ is shown in this example as using an extremely short PRI ($PRI_3 < PRI_2$). The PRI during a fourth time period $\tau_4$ is shown as returning to $PRI_1$ (in this particular example). The illustration of various PRIs in FIG. 2 is shown merely as an example of a sequence of different PRIs that may be used control the time interval between the arrival of adjacent input pulses at an EDFA.

The changes in PRI may be dictated by a system controller, which may quickly change the PRI in applications such as LIDAR as the physical environment changes (e.g., in a vehicle-based LIDAR, the PRI may change as the traffic pattern changes). As mentioned above, conventional MOPAs have been found to exhibit transients in the output energy as the PRI changes. The transients are related to the (unwanted) ASE generated within the EDFA as the seed pulses are being amplified. In particular, it has been found that the total ASE energy accumulated during a given time interval scales with the PRI; as the time interval between input seed pulses increases (i.e., PRI lengthens), the period of time during which ASE is generated increases as well, thereby increasing the total ASE generated during the time interval (which therefore gains the gain created during this time interval). Conversely, if the PRI is reduced in the length, a lesser amount of ASE is generated between subsequent signal pulses (again changing the gain provided between seed pulses). This variable ASE component thus results in unwanted fluctuations in the gain generated within the EDFA, resulting in creating transients in the energy of the amplifier output pulses.

Figure 3:
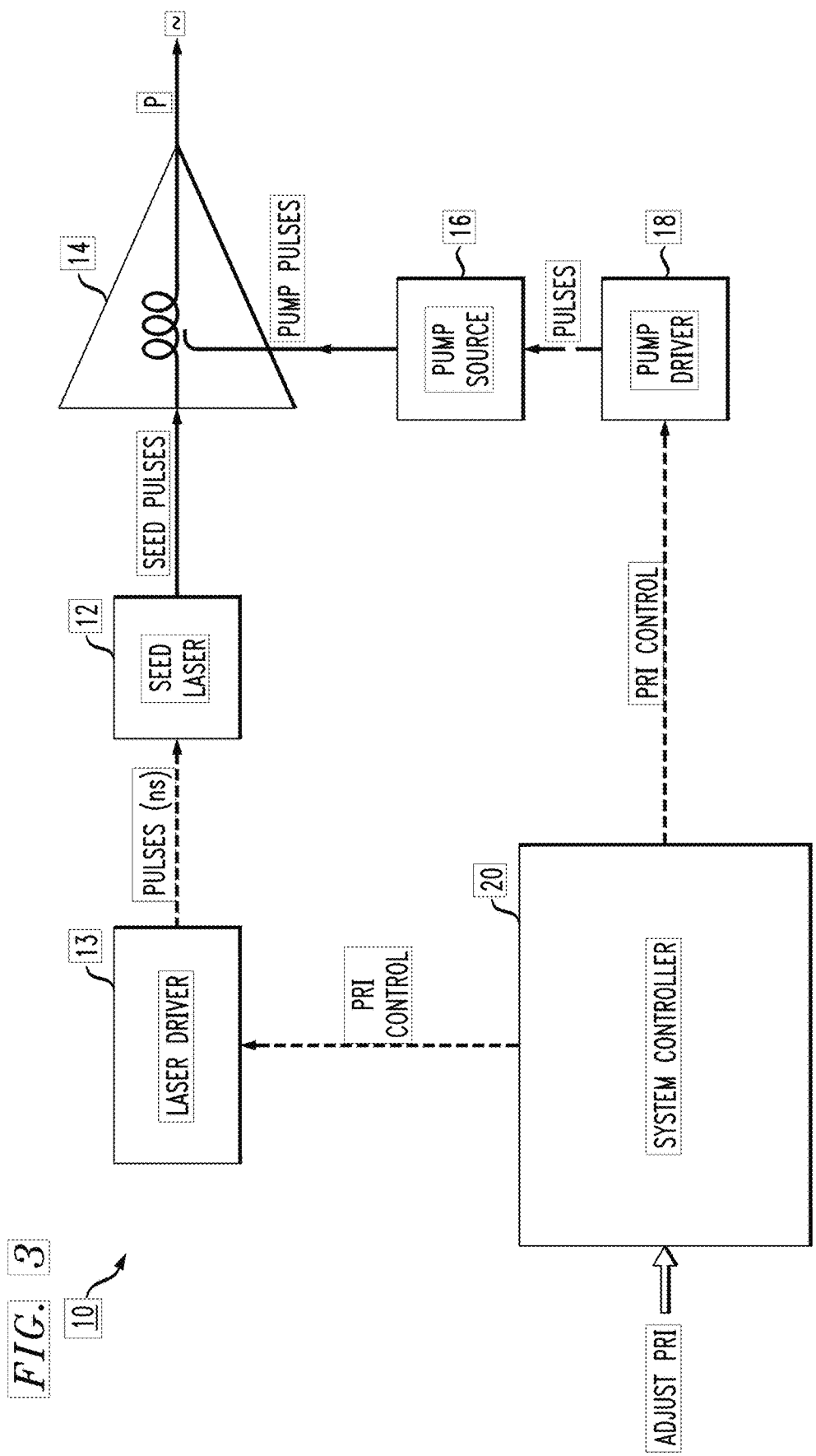
FIG. 3 illustrates an exemplary constant energy MOPA formed in accordance with the present invention.

FIG. 3 is a block diagram of an exemplary MOPA 10 formed in accordance with one or more embodiments of the present invention to provide transient-free output pulse energy, even under conditions where the PRI of the input seed pulse is frequently changed. As will be described below in association with FIGS. 3-6, controlling the parameters of the pump source has been found to allow for fluctuations in ASE to be compensated in a manner where the gain within the EDFA remains constant, and the output pulses thus exhibit a constant (transient-free) output energy level. Referring in particular to FIG. 3, MOPA 10 is shown as comprising an input laser source (seed source) 12 for generating extremely narrow seed pulses (e.g., nsec-scale pulse width) that are then applied as an input pulse signal to a fiber-based optical amplifier, here an erbium doped fiber amplifier (EDFA) 14. A pump source 16 is used to supply the light that stimulates emission from the dopants in the fiber core and amplifies any optical signal passing through the fiber (here, the seed pulses are the signal propagating through the fiber). In particular, the ultra-short (nsec) seed pulses trigger the generation of high-power pulses as the output from EDFA 14 (i.e., a "pump-and-dump" process) by releasing a given amount of optical energy stored in the doped fiber (the energy created by the presence of the pump light in the doped fiber). It is to be understood that other rare-earth dopants may be used in the formation of a fiber-based optical amplifier, with erbium only one such option. Thus, while the following description refers to "EDFA 14", it is to be understood as also including these various alternative dopant sources.

A driver circuit 13 provides an input electrical signal to seed laser 12, where the repetition rate of the current pulses from driver circuit 13 defines the PRI of the seed pulses generated by laser 12. Each pulse itself is relatively narrow (on the order of nsec), with the PRI varying perhaps over the range of about 100 nsec to about 100 µsec. In the illustration of FIG. 3, solid-line paths are used to denote optical signal paths and dotted-line paths are used to denote electrical signal paths.

In accordance with the principles of the present invention, pump source 16 is configured to provide pulses of pump light as a second input to EDFA 14 and controlled such that a single pump pulse is introduced into EDFA 14 during the PRI. Pump source 16 typically includes a laser diode configured to emit radiation at a wavelength known to provide optical amplification in the presence of a rare-earth dopant. When erbium is used as the dopant, a laser diode operating at a wavelength of 980 nm is typically used. In contrast to many prior art EDFAs that utilize a continuous wave (CW) pump, the constant output energy MOPA of the present invention utilizes pulses of pump light. As mentioned above, it has been found in the past that when the PRI is varied, a CW pump results in generating variable amounts of ASE during the time interval between adjacent input seed pulses as the PRI is changed (i.e., a transition between PRIs), creating undesirable transients in the energy of the high power output pulses.

In accordance with the principles of the present invention, a pump driver circuit 18 is included in MOPA 10 and utilized to apply a pulsed electrical drive current input to pump source 16 such that parameters of the pump pulse are controlled to create transient-free output pulses. Driver circuit 18 is configured to control both the pulse rate and pulse width of pulses of the pump light from source 16. As discussed in detail below, controlling the repetition rate of the pump pulses, as well as the width of the pump pulse, allows for contribution to the gain from ASE to be managed during PRI transitions such that the output pulse energy remains essentially constant.

Also shown in FIG. 3 is a system controller 20 that is utilized to control the operation of both laser driver 13 and pump driver 18, ensuring that they each operate with the same PRI. Since the amount of gain achieved within EDFA 14 is a function of the amount of pump light within the doped fiber core, the pump pulses are somewhat longer in duration than the input signal narrow pulse (the pump pulse width on the order of about 25 nsec to a few µsec, for example, as compared to input seed pulses on the order of tens of nsec). As will be discussed below, system controller 20 is further used to control the width of the pump pulses to equalize the amount of ASE present between each output pulse, even as the PRI changes. Said another way, pump pulses are controlled in both repetition rate and width such that the gain generated in the EDFA is held essentially constant, regardless of changes in the seed pulse PRI.

The total output energy $\varepsilon_T$ created by MOPA 10 in response to an input seed pulse can be expressed as follows:

$$\varepsilon_T = \varepsilon_S + \varepsilon_{ASE},$$

where $\varepsilon_s$ is the output energy associated with the amplified, high power output pulse P and $\varepsilon_{ASE}$ is the (unwanted) ASE noise generated during the same PRI by MOPA 10. For the purposes of the present invention, the total output energy created during a given PRI time period can also be expressed as:

$$\varepsilon_T = C_1 * \left( \int_0^{\tau_1} i_1 dt + \int_{t_1}^{\tau_2} i_1 dt \right)$$

where t=0 is defined as the beginning (trigger) for the seed pulse applied as an input to the EDFA, and $t_1$ is a given time duration of an input pump pulse necessary for generating the desired energy of output pulse P for a given pump current value $i_1$. The interval $t_1$ to $t_2$ (defined as $\Delta t$) is the time interval attributed to providing the energy to the ASE.

Without any type of ASE compensation, a longer time interval between seed pulses (a "slow PRI") allows for a rather large amount of ASE to accumulate, when compared to the amount of ASE accumulated during a shorter interval (a "fast PRI"). Transients in terms of the energy within an output pulse thus occur as the PRI changes between each of these time periods.

In accordance with the principles of the present invention, assuming that the amount of ASE generated remains constant during the operation of EDFA, the interval $\Delta t$ needs to scale linearly in accordance with changes in PRI. That is, when the PRI doubles in length, the interval $\Delta t$ needs to double as well in order to maintain a "constant" accumulation of ASE energy (and thereby maintain a constant gain) during that time interval. Similarly, if the PRI is cut in half, $\Delta t$ must also decrease by half as much. The pulse width of the pump pulse, as regulated by controller 20, thus changes by a predetermined amount in concert with changes in PRI to maintain a constant energy (transient-free) output pulse train.

Figure 4:
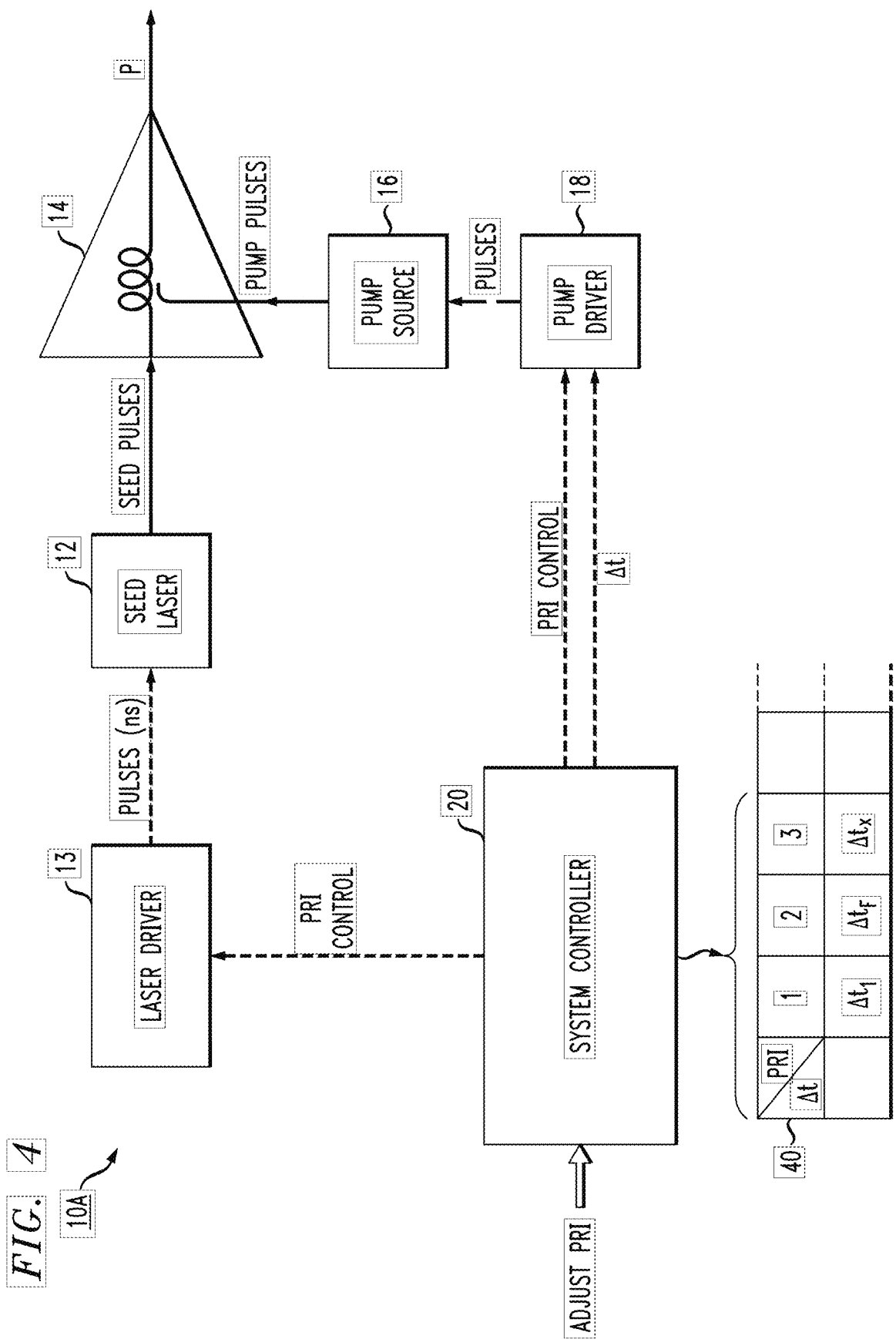
FIG. 4 illustrates an alternative embodiment of a MOPA formed in accordance with the present invention, illustrating a look-up table used to correlate changes in PRI with pump pulse adjustments to maintain constant gain.

FIG. 4 illustrates another embodiment of the present invention, denoted MOPA 10A, which includes a look-up table 40 that stores a set of a priori time intervals $\Delta t$ associated with providing specific adjustments in pump pulse width as a function of PRI. In one implementation, look-up table 40 may be included as a component within system controller 20. In this embodiment, therefore, when system controller 20 receives instructions to change to a new PRI, look-up table 40 is utilized to provide the proper pump pulse adjustment $\Delta t$ required to maintain a constant gain within EDFA 14. Thus, in the embodiment of FIG. 4, system controller 20 provides two inputs to pump driver 18, a first input defining the PRI and a second input defining the pulse width for that PRI value.

As mentioned above, the operation of laser driver circuit 13 and pump driver circuit 18 are preferably controlled such that seed pulses and pump pulses both exhibit the same PRI. It is to be noted that the seed pulses and pump pulses are not necessarily synchronized. In fact, a preferred embodiment of the present invention may be configured such that the pump pulse arrives at EDFA 14 slightly in advance of the seed pulse. By controlling the arrival times of the two pulses, the energy required to "fuel" the seed pulse is delivered "just in time" for that seed pulse and not spread across the entire pulse interval (which is the case for conventional CW pumping in a MOPA).

Figure 5:
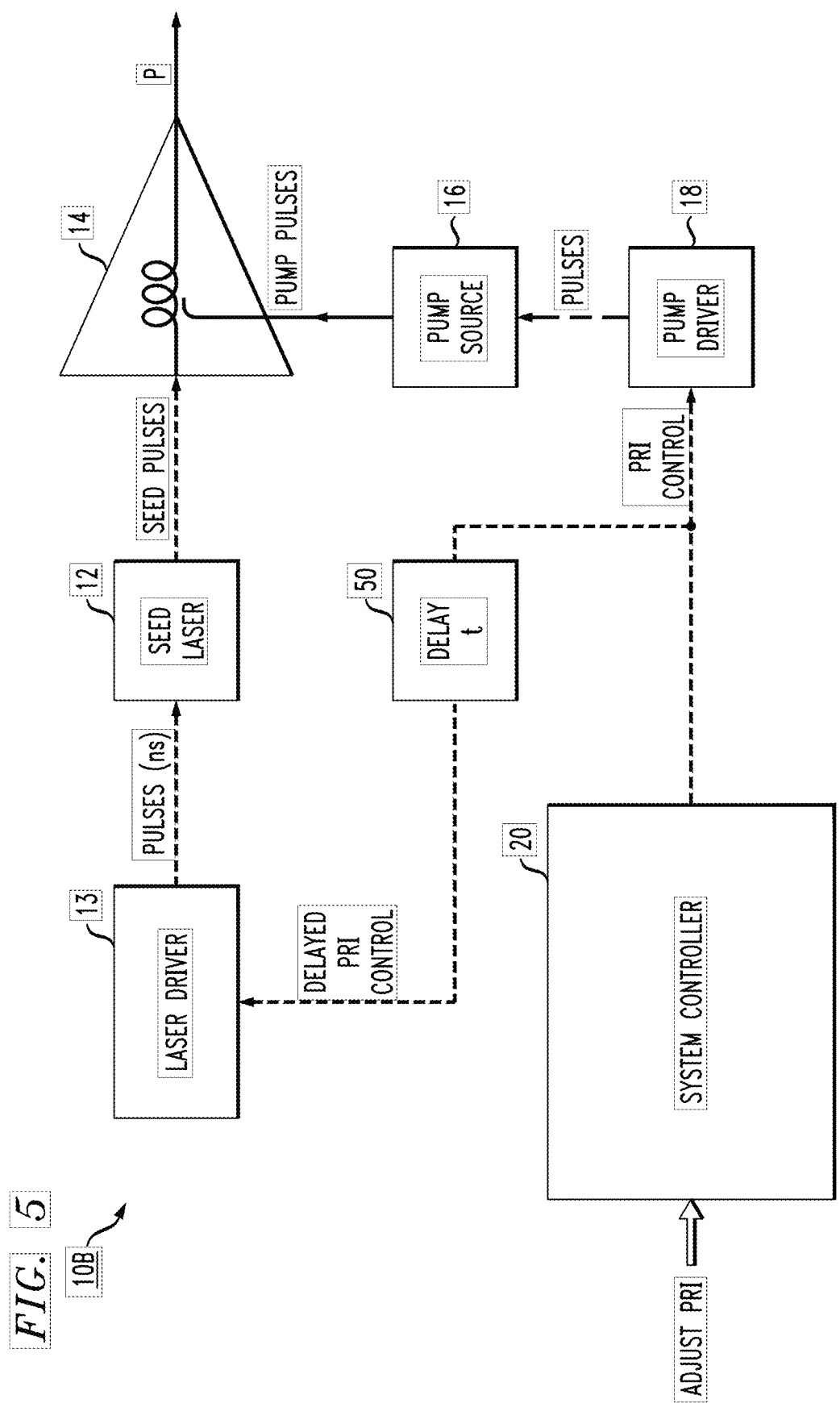
FIG. 5 shows yet another embodiment of a MOPA formed in accordance with the present invention, in this case including a delay element to control the arrival times of seed pulses and pump pulses at the fiber amplifier.

FIG. 5 illustrates an alternative embodiment of the present invention, shown as MOPA 10B, that is configured to time the arrival of the seed pulses with respect to the pump pulses. Besides the components discussed above in accordance with the embodiment of FIG. 3, MOPA 10B of FIG. 3 includes a delay element 50 disposed between controller 20 and laser driver circuit 13. Delay element 50 functions to shift the arrival of the seed pulses until slightly after the arrival of the pump pulses, while maintaining the same PRI for both pulse streams.

Figure 6:
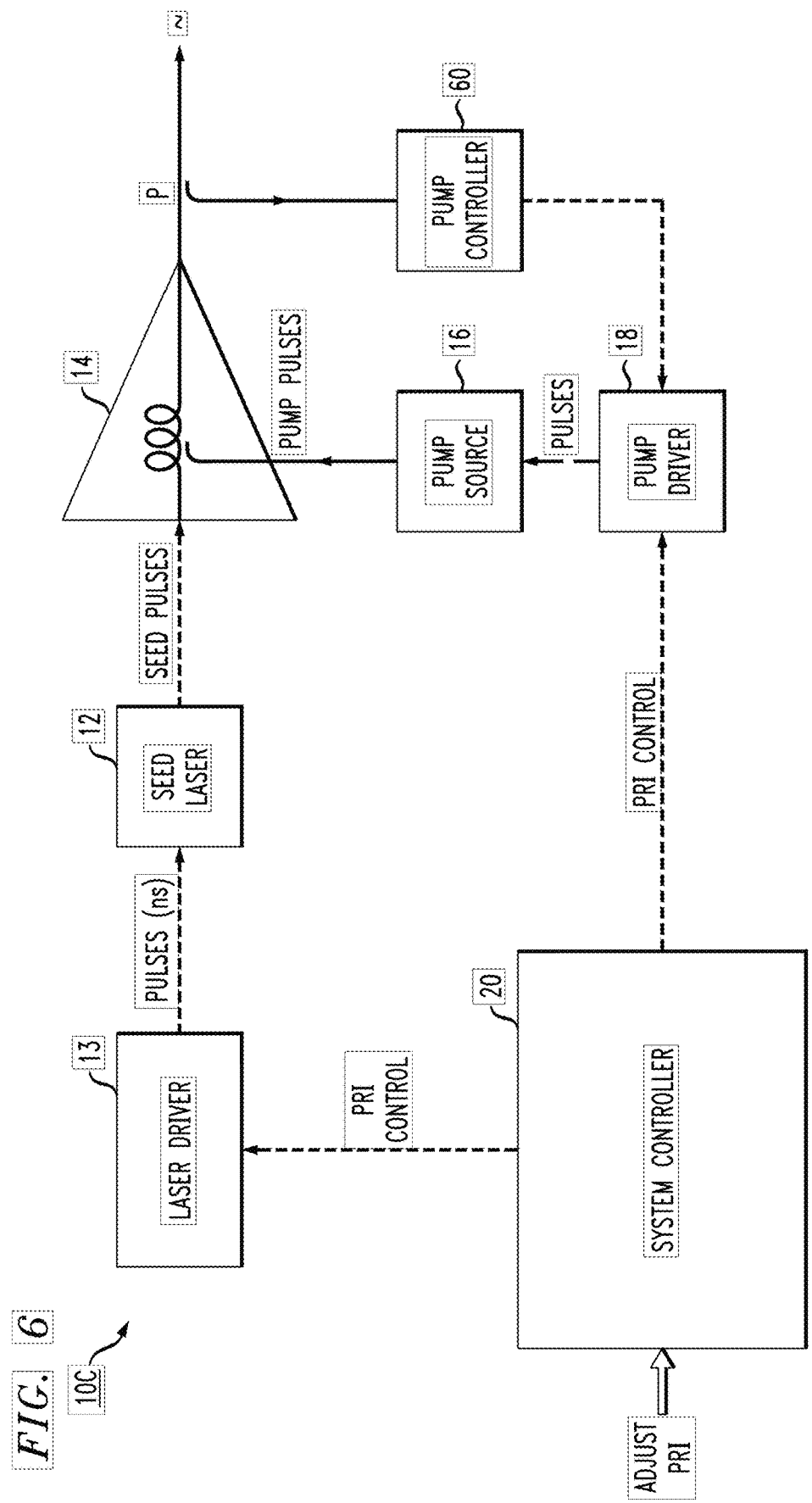
FIG. 6 illustrates an embodiment of the present invention where the inventive MOPA further comprises a feedback path between the fiber amplifier output and the pump source input.

There are a variety of applications where a MOPA is subjected to environmental changes (such as changes in ambient temperature) that impact the performance of the amplifier. As the components age, their performance may also be impacted. FIG. 6 illustrates an exemplary MOPA 10C formed in accordance with the present invention that includes a feedback loop between the output of EDFA 14 and pump driver 18. In operation, a portion of the amplified, high power pulses P is coupled into a feedback optical signal path and applied as an input to pump controller 60. Controller 60 converts the received optical signal into an electrical equivalent that is thereafter analyzed to determine if any adjustments are necessary to pump source 16 (e.g., adjusting the drive current applied to pump source 16, changing the bias voltage applied pump source 16, etc.). In an alternative embodiment, the electrical signal created by pump controller 60 may be applied as an input to system controller 20 that is particularly configured to analyze this feedback and provide the necessary adjustments to the operating parameters of pump source 16 via pump driver 18.

Thus, in accordance with the present invention, the ability to modify pump pulse characteristics allows for the shaded ASE regions to be equalized, regardless of PRI, by adjusting the operating parameters of the pump source. Various additional modifications of this invention will occur to those skilled in the art. All deviations from the specific teachings of this specification that basically rely on the principles and their equivalents through which the art has been advanced are properly considered to be within the scope of the invention as described and claimed.

What is claimed is:

1. A master oscillator power amplifier (MOPA) comprising:
   a section of doped optical fiber for providing signal gain to input light in the presence of a pump light beam operating at a defined wavelength;
   an input pulse source for generating seed pulses applied as a first input to the section of doped optical fiber, the input pulse source designed to adjust a pulse repetition interval (PRI) between adjacent pulses in response to a "PRI change" control signal; and
   a pump source for generating pump pulses applied as a second input to the section of doped optical fiber, wherein the presence of the seed and pump pulses within the section of doped optical fiber amplifies the power of the seed pulses and generates high-power optical output pulses,
   the pump source designed to control pump pulse parameters including repetition rate and pulse width to maintain an essentially constant signal gain in the section of doped optical fiber to provide transient-free energy in the high-power optical output pulses regardless of changes in the seed pulse PRI.

2. The MOPA as defined in claim 1 wherein the MOPA further comprises
   a laser driver circuit coupled to the input pulse source;
   a pump driver circuit coupled to the pump source; and
   a control circuit coupled to the laser driver circuit and the pump driver circuit for transmitting the PRI change control signal to both the laser driver circuit and the pump driver circuit.

3. The MOPA as defined in claim 2 wherein the pump driver circuit modifies a pump pulse width in the presence of a PRI change control signal to maintain an essentially constant accumulation of amplified spontaneous emission between seed pulses, regardless of changes in PRI.

4. The MOPA as defined in claim 1 wherein the MOPA further comprises a delay element for controlling arrival times of the seed pulses and the pump pulses at the section of doped optical fiber such that a pump pulse arrives slightly before its associated seed pulse.

5. The MOPA as defined in claim 2 wherein the control circuit is configured to adjust a width of the pump pulse as a function of changes in seed pulse PRI to maintain constant gain in the section of doped optical fiber.

6. The MOPA as defined in claim 1 wherein the MOPA further comprises a feedback path between the output of the section of doped optical fiber and the pump driver circuit, the feedback path used to adjust either one or both of a drive current and a bias voltage applied to the pump source.

7. The MOPA as defined in claim 1 wherein the section of doped optical fiber includes an erbium dopant and the pump source generates pump pulses at a wavelength of 980 nm.

8. A LIDAR system comprising
   a master optical power amplifier (MOPA) source of high power optical pulses, the master optical power amplifier including
      a section of doped optical fiber for providing signal gain to input light in the presence of a pump light beam operating at a defined wavelength and generating as an output high power optical pulses which are thereafter directed to an external target;
      an input pulse source for generating seed pulses applied as a first input to the section of doped optical fiber, the input pulse source designed to adjust a pulse repetition interval (PRI) between adjacent pulses in response to a "PRI change" control signal; and
      a pump source for generating pump pulses applied as a second input to the section of doped optical fiber, wherein the presence of the seed and pump pulses within the section of doped optical fiber amplifies the power of the seed pulses and generates the high power optical output pulses, the pump source designed to control pump pulse parameters including repetition rate and pulse width to maintain an essentially constant signal gain in the section of doped optical fiber to provide transient-free energy in the high power optical output pulses regardless of changes in the seed pulse PRI;
   an optical receiver configured to detect at least a portion of returned optical pulses reflected or scattered by the target into the LIDAR system, the optical receiver further configured to analyze the portion of returned optical pulses and determine therefrom a distance between the LIDAR system and the target; and
   an optical beam splitter disposed between the MOPA source of high power optical pulses and the optical receiver and configured to direct the high power optical pulses toward the target and direct the portion of returned optical pulses toward the optical receiver.

9. The LIDAR system as defined in claim 8 wherein the MOPA source of high power optical pulses further comprises
   a laser driver circuit coupled to the input pulse source;
   a pump driver circuit coupled to the pump source; and
   a control circuit coupled to the laser driver circuit and the pump driver circuit for transmitting the PRI change control signal to both the laser driver circuit and the pump driver circuit.

10. The LIDAR system as defined in claim 9 wherein the pump driver circuit modifies a pump pulse width in the presence of a PRI change control signal to maintain an essentially constant accumulation of amplified spontaneous emission between seed pulses, regardless of changes in PRI.

11. The LIDAR system as defined in claim 8 wherein the MOPA source of high power optical pulses further comprises a delay element for controlling arrival times of the seed pulses and the pump pulses at the section of doped optical fiber such that a pump pulse arrives slightly before its associated seed pulse.

12. The LIDAR system as defined in claim 9 wherein the control circuit is configured to adjust a width of the pump pulse as a function of changes in seed pulse PRI to maintain constant gain in the section of doped optical fiber.

13. The LIDAR system as defined in claim 8 wherein the MOPA source of high power pulses further comprises a feedback path between the output of the section of doped optical fiber and the pump driver circuit, the feedback path used to adjust either one or both of a drive current and a bias voltage applied to the pump source.

\* \* \* \* \*